(12) United States Patent
Ye

(10) Patent No.: US 10,443,138 B2
(45) Date of Patent: Oct. 15, 2019

(54) METHOD FOR ELECTROLYTIC RECYCLING AND REGENERATING ACIDIC CUPRIC CHLORIDE ETCHANTS

(71) Applicant: Yiting Ye, Macau (CN)

(72) Inventor: Yiting Ye, Macau (CN)

( * ) Notice: Subject to any disclaimer, the term of this patent is extended or adjusted under 35 U.S.C. 154(b) by 174 days.

(21) Appl. No.: 15/252,189

(22) Filed: Aug. 30, 2016

(65) Prior Publication Data

US 2017/0058408 A1 Mar. 2, 2017

(30) Foreign Application Priority Data

Aug. 31, 2015 (CN) .......................... 2015 1 0546335
Jan. 7, 2016 (CN) .......................... 2016 1 0011316
(Continued)

(51) Int. Cl.
*C25B 1/26* (2006.01)
*C25B 1/22* (2006.01)
(Continued)

(52) U.S. Cl.
CPC ................ *C25B 1/26* (2013.01); *C23F 1/46* (2013.01); *C25B 1/22* (2013.01); *C25B 15/08* (2013.01);
(Continued)

(58) Field of Classification Search
CPC ... C25B 1/26; C25B 1/22; C25B 15/08; C23F 1/46; C25C 1/12; Y02P 10/212; H05K 3/067
See application file for complete search history.

(56) References Cited

U.S. PATENT DOCUMENTS 3,794,571 A 2/1974 Beyer
4,107,011 A * 8/1978 Kucherenko ............. C23F 1/46
205/755
(Continued)

FOREIGN PATENT DOCUMENTS

CN 104313584 1/2015
CN 104313584 A * 1/2015
CN 104762620 7/2015

OTHER PUBLICATIONS

"Office Action of Taiwan Counterpart Application", dated Mar. 2, 2017, p. 1-p. 8, in which the listed references were cited.

*Primary Examiner* — Louis J Rufo
(74) *Attorney, Agent, or Firm* — JCIPRNET

(57) ABSTRACT

A method for electrolytic recycling and regenerating acidic cupric chloride etchants, comprising: (1) employing an acidic cupric chloride etchant that contains iron ions in PCB etching, controlling the oxidation-reduction potential (ORP) of said acidic cupric chloride etchant within the range of 360-700 mV; (2) transferring an etchant waste of step (1) to an electrolysis tank and electrolyzing said etchant waste; (3) the chlorine gas generated by electrolysis oxidizes the electrolyte in the electrolysis tank and thereby dissolved into the electrolyte, in the effect of the ORP of the electrolyte; (4) regenerating an etchant by oxidizing Fe(II) ions and Cu(I) ions in the electrolyte to Fe(III) ions and Cu(II) ions using the chlorine gas of step (3) that is dissolved into the electrolyte, and when the chlorine gas is fully dissolved into the electrolyte, the oxidizing step of the electrolyte is finished and an etchant is regenerated; (5) transferring the etchant regenerated in step (4) to an etching production line.

25 Claims, 5 Drawing Sheets

(30) Foreign Application Priority Data

May 11, 2016 (CN) .......................... 2016 1 0307861
Jun. 24, 2016 (CN) .......................... 2016 1 0480698

(51) Int. Cl.
*C25B 15/08* (2006.01)
*C25C 1/12* (2006.01)
*C23F 1/46* (2006.01)
*H05K 3/06* (2006.01)

(52) U.S. Cl.
CPC ................ *C25C 1/12* (2013.01); *H05K 3/067* (2013.01); *Y02P 10/212* (2015.11)

(56) References Cited

U.S. PATENT DOCUMENTS

| | | | | |
|---|---|---|---|---|
| 4,468,305 A | * | 8/1984 | Hillis | C23F 1/46 205/574 |
| 5,393,387 A | * | 2/1995 | Mikami | C23F 1/46 205/586 |
| 2015/0361342 A1 | * | 12/2015 | Ye | H05K 3/002 252/79.2 |

* cited by examiner

METHOD FOR ELECTROLYTIC RECYCLING AND REGENERATING ACIDIC CUPRIC CHLORIDE ETCHANTS

FIELD OF INVENTION

The present invention relates to the recycling and regeneration of printed circuit board etchants, particularly relates to a method for electrolytic recycling and regenerating acidic cupric chloride etchants.

TECHNICAL BACKGROUND

In the etching of printed circuit boards (PCBs), an etchant is continuously sprayed onto pre-developed copper-clad laminates, etching away the unprotected copper to form circuits. It has been a common practice to use either acidic cupric chloride or ferric chloride etching method for copper etching. The acidic cupric chloride etching method relies on the use of an acidic cupric chloride etchant, the main components of which are: (1) cupric chloride, the main copper-etching agent, (2) an oxidant and (3) a sub-etchant that mainly contains hydrochloric acid. The composition of the etchant changes continuously as it reacts with copper-clad laminates during etching, therefore an automatic detection and charging control machine is widely employed to detect various parameters of the etchant, such as the oxidation-reduction potential (ORP), specific density, concentration of dissociated hydrogen ions, etc. Upon detection of these parameters, the machine calculates and charges appropriate amounts of oxidant, water and sub-etchant to the etchant to automatically and continuously regenerate the etchant.

In the above-mentioned etching process, the continuous charging of oxidant, water and sub-etchant inevitably results in an overflow of excess etchant from the etching tank, forming the so-called "etchant waste". The main components of such etchant waste of an acidic cupric chloride etchant are: cupric chloride, cuprous chloride, hydrochloric acid and chloride salts, with concentration of copper ions typically higher than 50 g/L (0.8 mol/L). In industry, the etchant waste is usually collected and treated by hazardous chemical waste recycling companies, where they are converted into cupric sulphate or tribasic copper chloride. Some PCB manufacturing factories choose to self-treat the etchant waste by electrolysis. During electrolysis, the following reduction reactions take place on the cathode board:

On the anode board, the following oxidation reaction simultaneously takes place:

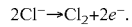

While the copper metal formed on cathode board can be removed and reused, poisonous chlorine gas is liberated from the anode board. It has been observed that part of the Cu(I) ions in the electrolyte are oxidized to Cu(II) ions by some of the chlorine gas formed. By adding hydrochloric acid and other chemicals to this oxidized electrolyte, the sub-etchant can be regenerated, which can be then added to the etching production line to take part in etching.

However, the etching and electrolysis methods discussed above have the following disadvantages:

1. The chlorine gas generated is not completely absorbed by the electrolyte: as discussed above, the Cu(I) ions in conventional acidic cupric chloride etchant wastes react with gaseous chlorine in electrolysis. It has been observed that when in excess, Cu(I) ions tend to encourage a formation of copper sludge precipitate during etching. This precipitate greatly slows down etching rate to a point that industrial production requirements are not met. Therefore, the concentration of Cu(I) ions in the etchant needs to be kept relatively low. Consequentially, Cu(I) ion concentration in the etchant waste is low, and most of the chlorine gas from electrolysis does not have sufficient time to react with Cu(I) ions before escaping to the atmosphere, i.e. the electrolyte is unable to fully absorb and consume the large amount of poisonous chlorine gas produced in electrolysis. Chlorine gas treatment is therefore necessary. At present, the two chlorine treating methods described below are widely used:

(A) Sodium hydroxide spray treatment: chlorine gas is vacuumed from the electrolysis tank to a neutralising spray absorption tower by an exhaust system. It is then neutralised by a sodium hydroxide spray. This method requires a large amount of sodium hydroxide for chlorine treatment, and the chlorine gas cannot be reused.

(B) Etchant waste spray treatment: similar to sodium hydroxide spray treatment, chlorine gas is vacuumed from the electrolysis tank to a spray absorption tower, before being treated by an etchant waste spray. The chlorine gas oxidizes the etchant waste in this process, and the oxidized etchant waste can be collected and reused in etching. In this method, although some chlorine gas can be reused, there still remains a substantial amount of unreacted chlorine gas and HCl gas due to the high concentration of volatile HCl and low concentration of Cu(I) ions in the etchant waste. The chlorine gas and HCl gas need to be treated again in another neutralising spray absorption tower. When both installed indoors, the two spray absorption towers undesirably take up much workspace. If one or both spray absorption towers are installed outdoors, long tubes are required to transmit the chlorine gas stream, which leads to increased possibility of chlorine leakage, posing severe safety risks.

2. Uncontrollable hydrogen gas formation: acidic cupric chloride etchant wastes tend to contain a large amount of hydrogen ions. In the case of high current density or exceedingly low copper ion concentration, a substantial amount of hydrogen gas tends to form at the cathode, which may lead to explosion.

3. Low electrolysis current efficiency: current efficiency is the ratio of the actual mass of a substance liberated from an electrolyte by the passage of current to the theoretical mass liberated according to Faraday's law. During the above-mentioned electrolysis process, Cu(II) ions are firstly reduced to Cu(I) ions, which are subsequently reduced to metal copper. A low current efficiency is typically observed, possibly due to (a) some Cu(II) ions not having enough electrical energy to fully convert to metal copper, and (b) the intermediate Cu(I) ions attacking and corroding the metal copper formed.

4. Low level of synchronisation: in current industry practice, etching, electrolysis, regeneration and recycling processes are typically separated. There lacks a unified system to allow process synchronisation. It is difficult, for example, to flexibly adjust the etching production parameters or the composition of the etchant in order to match the rate of electrolysis and the subsequent etchant regeneration and recycle process.

5. Large amounts of raw materials required: in electrolysis, due to substantial hydrogen gas formation, the concentration of hydrogen ions in the electrolyte is usually very low. In order to regenerate the sub-etchant from the electrolyte, a large amount of hydrochloric acid is required. In etching, liquid oxidants are continuously added to oxidize Cu(I) ions in the etchant. The addition of oxidants, hydrochloric acid and other raw materials results in increased cost of not only production, but also storage and further treatment due to the continual increase of etchant volume.

Electrolytic recycling and regeneration methods specially designed for acidic cupric chloride etchant wastes have been proposed. In these methods, anode boards with rare earth coatings are employed, in an attempt to decrease chlorine and hydrogen gas evolution. However, none of these methods have been in wide spread use, probably due to the high fabrication and maintenance cost for such anode boards.

Chinese patent 201510117884.3 offers an improved acidic cupric chloride etchant. Ferric chloride is added to the etchant composition as an auxiliary etching agent. When operating in a high-acidity system, the said etchant increases etching rate while maintaining good etching quality. When operating in a low-acidity system, etching quality is improved, and etching rates are maintained at a level that is comparable to conventional acidic cupric chloride etchants. The said etchant comprises cupric chloride, a sub-etchant and an oxidant. The sub-etchant comprises the following components in weight percentage: 1%-36.5% of HCl, 0.01%-45% of one or more compounds selected from $FeCl_3$, $FeCl_2$, Fe, FeO and $Fe_2O_3$ and the balance of water. The control parameters of a production process using the said etchant are set as follows: the concentration of dissociated hydrogen ions is 0.1-5.0M, the ORP is 380-700 mV and the concentration of copper ions is 1-180 g/L. The present invention is a method designed for the recycling and regeneration of the said acidic cupric chloride etchant.

SUMMARY OF THE INVENTION

The present invention aims at providing a method for electrolytic recycling and regenerating acidic cupric chloride etchants. In the said method, most chlorine gas produced in electrolysis is absorbed and consumed, thereby improving manufacture safety, reducing environmental impact, as well as consuming less production raw materials.

The object of the invention is realised by the following technical proposal:
A method for electrolytic recycling and regenerating acidic cupric chloride etchants, characterised in that it comprises the following steps:
step 1: employing an acidic cupric chloride etchant that contains iron ions in PCB etching, controlling ORP of said acidic cupric chloride etchant within the range of 360-700 mV;
step 2: transferring an etchant waste of said acidic cupric chloride etchant to an electrolysis tank; electrolysing said etchant waste;
step 3: generating metal copper on a cathode board and chlorine gas on an anode board in the electrolysis process of step 2; the chlorine gas generated oxidizes the electrolyte in the electrolysis tank and is dissolved into the electrolyte, in the effect of ORP of the electrolyte;
step 4: regenerating an etchant by oxidizing Fe(II) ions and Cu(I) ions in the electrolyte to Fe(III) ions and Cu(II) ions using the chlorine gas that is fully dissolved into the electrolyte;
step 5: transferring the etchant regenerated in step 4 to an etching production line. The method of the present invention is particularly designed for treating the waste of the acidic cupric chloride PCB etchant described in CN201510117884.3, in which one or more compounds selected from $FeCl_3$, $FeCl_2$, Fe, FeO and $Fe_2O_3$ are added to its sub-etchant. As etchant waste is referred to as an overflowed etchant from etchant tank, its composition and ORP are similar to those of the etchant. The etchant waste of said acidic cupric chloride etchant in step 1 contains not only copper ions but also iron ions, i.e. $Fe^{3+}$, $Cu^{2+}$, $Fe^{2+}$, and $Cu^+$ ions are present. By controlling the ORP of the etchant, the ratio of metal ions with higher oxidation states (i.e. $Fe^{3+}$ and $Cu^{2+}$) to metal ions with lower oxidation states (i.e. $Fe^{2+}$ and $Cu^+$) can be effectively controlled. The etchant waste can thus maintain a sufficiently strong reducing power, thereby quickly reducing most of the chlorine gas produced in electrolysis to chloride ions. The unreacted chlorine gas is relatively small in quantity and can be easily dissolved into the electrolyte.

According to repeated studies by the inventor, by adjusting etchant ORP during etching, equilibrium between rate of etching and rate of electrolysis are reached, and the chlorine gas generated in electrolysis is completely absorbed by the electrolyte. When the ORP of the etchant is kept within the range of 360-700 mV, the etching rate satisfies industrial production requirements, and most of the chlorine gas formed in electrolysis is absorbed by the electrolyte. As $Fe^{3+}$ and $Cu^{2+}$ ions generated by chlorine oxidation of the electrolyte are capable of etching copper, the oxidized electrolyte can act as an etchant. Although the composition of the regenerated etchant is not identical to the etchant initially employed in step 1, it has certain copper-etching capability and can be introduced to the etching production line to take part in etching. In addition, the chlorine gas dissolved in the electrolyte can conveniently act as an oxidant to take part in etchant regeneration on the etching production line, reducing the amounts of liquid oxidant and sub-etchant required, thereby reducing etching production cost.

The present invention can be improved as follows: installing an electrolytic diaphragm inside the electrolysis tank, separating the electrolysis tank into an anode chamber and a cathode chamber which respectively encloses an anode and a cathode; keeping a concentration of copper ions in a cathode chamber electrolyte lower than that in an anode chamber electrolyte, in order to improve current efficiency in electrolysis.

The term "cathode chamber electrolyte" refers to the electrolyte contained in the cathode chamber, and the term "anode chamber electrolyte" refers to the electrolyte contained in the anode chamber.

The electrolytic diaphragm creates a copper ion concentration difference between the anode chamber electrolyte and the cathode chamber electrolyte. The concentration of copper ions in the cathode chamber electrolyte is kept relatively low, so that the limit current of Cu(II) ions reducing to Cu(I) ions can be overcome easily. Cu(II) ions can be reduced directly to metal copper without converting to Cu(I) ions first, thereby improving both current efficiency in electrolysis and percentage yield of metal copper.

The present invention can be further improved as follows: in step 2, transferring said etchant waste to the anode chamber, transferring a diluted etchant waste solution to the cathode chamber; in said diluted etchant waste solution, only a mass concentration of copper ions in the etchant waste is diluted, so that the mass concentration of copper ions in said diluted etchant waste solution is lower than that in the etchant waste; additionally, the total mass concentration of iron ions in the diluted etchant waste solution satisfies the formula:

−50%≤[(total mass concentration of iron ions in said diluted etchant waste solution-total mass concentration of iron ions in said etchant waste)÷total mass concentration of iron ions in the anode chamber electrolyte]≤50%.

It has been experimentally proved that the initial concentration of hydrochloric acid in the cathode chamber electrolyte does not have a significant impact on the outcome of the present invention; therefore there is no limitation on the concentration of hydrochloric acid in the cathode chamber electrolyte. The total mass concentration of iron ions is the sum of the mass concentration of Fe (II) ions and Fe(III) ions. It is desirable to maintain the initial total mass concentration of iron ions in the cathode chamber electrolyte (i.e. the diluted etchant waste solution) within the limitation of the above-stated formula to ensure a uniform regenerated etchant and a stable etching rate in the subsequent oxidation and etching processes. In other words, the difference between the total mass concentration of iron ions in the regenerated etchant and the etchant in the etching tank should not be too large, to avoid dramatic changes in etchant composition when the regenerated etchant is supplied to the etching production line, which is likely to affect etching rate.

In actual operation, before electrolysis, one part of the etchant waste collected from the etching production line is directly transferred to the anode chamber, and the other part of the etchant waste is first mixed with the sub-etchant of the acidic cupric chloride etchant employed in step 1 to form the diluted etchant waste solution, before being transferred to the cathode chamber. Alternatively, all etchant waste collected is directly transferred to the anode chamber, and the diluted etchant waste solution is prepared using chemical raw materials, before being transferred to the cathode chamber. The concentration of copper ions in the diluted etchant waste solution should be lower than that in the etchant waste. As electrolysis proceeds and metal copper gradually deposits on the cathode board, the concentration of copper ions in the cathode chamber electrolyte decreases. When the concentration of copper ions is too low, a large portion of the hydrogen ions present in the electrolyte will attach to the cathode board, resulting in the formation of a large volume of hydrogen gas. Therefore, the concentration of copper ions in the cathode chamber electrolyte needs to be maintained at a certain level. Therefore, the present invention can also be improved as follows: maintaining the mass concentration of copper ions in the cathode chamber electrolyte lower than the mass concentration of copper ions in the anode chamber electrolyte by employing an etchant waste charging device; said etchant waste device controls the mass concentration of copper ions in the cathode chamber electrolyte in real time.

The etchant waste charging device includes a copper ion concentration monitor and a metering pump. When the concentration of copper ions in cathode chamber electrolyte is detected to be lower than the set value of the etchant waste charging device, the copper ion concentration monitor can control the metering pump to automatically add unelectrolysed etchant waste to the cathode chamber, until the concentration of copper ions in cathode chamber electrolyte is greater than or equal to the set value. The copper ion concentration monitor can be a specific density monitor or a photoelectric colorimetric monitor or other commercially available monitors that are able to monitor copper ions.

The present invention can be further improved as follows: installing a sealing cover plate on the top of the anode chamber in order to prevent the chlorine gas escaping to the atmosphere, to accelerate the oxidation of electrolyte by the chlorine gas and to accelerate the dissolution of chlorine gas into the electrolyte.

The present invention can be yet further improved as follows: installing a liquid intake pipe and a liquid outlet pipe on both the cathode chamber and the anode chamber; said liquid outlet pipe of the anode chamber is installed on the sealing cover plate, allowing the anode chamber to be fully-filled by the electrolyte, assisting the dissolution of chlorine gas. While transferring the oxidized electrolyte to the etching production line, the electrolytes from the anode chamber and the cathode chamber can either be transferred separately and mixed on the etching production line, or firstly mixed in a mixing pipe which is connected to the two liquid outlet pipes installed on the cathode chamber and anode chamber, before transferred to the etching production line.

The present invention can also be improved as follows: setting a hydrogen gas exhaust system above the said cathode chamber. The hydrogen exhaust system can exhaust the hydrogen gas formed on the cathode board, preventing the accumulation of hydrogen gas in the production area, eliminating potential explosion hazards.

The acidic cupric chloride etchant in step 1 comprises cupric chloride and a sub-etchant; an automatic detection and charging control machine is employed to detect the concentration of dissociated hydrogen ions, ORP and specific density parameters of the acidic cupric chloride etchant and to control the charging amount of each component, allowing the concentration of copper ions, concentration of dissociated hydrogen ions and ORP in the acidic cupric chloride etchant solution to reach set numerical values; for a total weight percentage of 100%, the sub-etchant comprises the following components in weight percentage:

2%-36% of HCl;
1%-35% of one or more compounds selected from $FeCl_3$, $FeCl_2$, Fe, FeO and $Fe_2O_3$; and
the balance of water, the control parameters of the acidic cupric chloride etchant obtained are set as follows: the concentration of dissociated hydrogen ions is 0.2-5.0M, the ORP is 360-700 mV and the concentration of copper ions is 15-180 g/L.

As discussed above, the regenerated etchant in step 4 and 5 may contain a small amount of chlorine gas residual. This chlorine gas can react with Fe(II) ions and Cu(I) ions in the etchant contained in the etching tank, converting them to copper-etching Fe(II) and Cu(I) ions when the regenerated etchant is transferred to the etching production line. As a result, the additional oxidants required in the acidic cupric chloride etchant composition described in Chinese patent 201510117884.3 can be omitted, provided that the concentrations of Fe(III) ions and Cu(II) ions in the etchant contained in the etching tank are relatively stable. Preferably, employ the automatic detection and charging control machine on the etching production line to detect the concentration of dissociated hydrogen ions, the ORP and the specific density of the acidic cupric chloride etchant, in order to control the charging of the sub-etchant according to the concentration of dissociated hydrogen ions and ORP detected, and also to control the charging of water according to the specific density detected, so the concentration of dissociated hydrogen ions is 0.2-5.0M, the ORP is 380-700 mV and the concentration of copper ions is 15-180 g/L.

The above-mentioned acidic cupric chloride etchant of the present invention has a lower concentration of dissociated hydrogen ions when compared to conventional acidic cupric chloride etchants. Accordingly, the concentration of dissociated hydrogen ions in its etchant waste is relatively low. This results in decreased hydrogen production during electrolysis in an identical electrolytic current density. Additionally, the acidic cupric chloride etchant contains one or more compounds selected from the group consisting of $FeCl_3$, $FeCl_2$, Fe, FeO and $Fe_2O_3$, maintaining a relatively high etching rate even when HCl concentration is relatively low. This is because $FeCl_3$ is the actual active compound among the group consisting of $FeCl_3$, $FeCl_2$, Fe, FeO and $Fe_2O_3$. $FeCl_3$ accelerates the etching rate by (1) reacting with copper, forming ferrous chloride and cuprous chloride; (2) oxidizing cuprous chloride to cupric chloride; and (3) removing the oxide layer on the copper surface which hinders etching. Several iron compounds apart from $FeCl_3$ can also be used, as they can react with hydrochloric acid and/or oxidant(s) in the etchant to generate $FeCl_3$. Therefore, there are no limitations on the mixing ratio of the compounds; they can be mixed in any proportion, as long as the final $FeCl_3$ generated in the etchant is within the range of the invention.

More preferably, for a total weight percentage of 100%, the sub-etchant comprises the following components in weight percentage: 2%-30% of HCl; 3%-30% of one or more compounds selected from $FeCl_3$, $FeCl_2$, Fe, FeO and $Fe_2O_3$; and the balance of water. Even more preferably, for a total weight percentage of 100%, the sub-etchant comprises the following components in weight percentage: 3%-28% of HCl; 3.5%-25% of one or more compounds selected from $FeCl_3$, $FeCl_2$, Fe, FeO and $Fe_2O_3$; and the balance of water. There are no limitations on the mixing ratio of the one or more compounds selected from the group consisting of $FeCl_3$, $FeCl_2$, Fe, FeO and $Fe_2O_3$; they can be mixed in any proportion, as long as the final $FeCl_3$ generated in the etchant is within the range of the sub-etchant.

Preferably, keeping the control parameters of a production process using the acidic cupric chloride etchant as follows: the concentration of dissociated hydrogen ions is 0.2-4.0M, the ORP is 380-700 mV and the concentration of copper ions is 15-180 g/L.

More preferably, keeping the control parameters of the acidic cupric chloride etchant in step 1 as follows: the concentration of dissociated hydrogen ions is 0.2-4.0M, the ORP is 400-650 mV and the concentration of copper ions is 20-150 g/L.

Even more preferably, keeping the control parameters of the acidic cupric chloride etchant in step 1 as follows: the concentration of dissociated hydrogen ions is 0.2-3.0M, the ORP is 400-620 mV and the concentration of copper ions is 25-140 g/L.

The present invention can also be improved as follows: the sub-etchant of the acidic cupric chloride etchant in step 1 further comprises 0.001 wt %-14 wt % of cupric chloride and/or cuprous chloride.

There are no limitations on the mixing ratio of cupric chloride and cuprous chloride when both compounds are selected; they can be mixed in any proportion.

The present invention can also be improved as follows: the sub-etchant of the acidic cupric chloride etchant in step 1 further comprises 1 wt %-8 wt % of an etchant additive, said etchant additive is NaCl and/or $NH_4Cl$. The addition of an etchant additive increases chloride iron concentration of the etchant. Conversion of copper to cupric chloride is thus accelerated due to the common-ion effect. When both NaCl and $NH_4Cl$ are selected, there are no limitations on the mixing ratio of the two compounds; they can be mixed in any proportion.

The present invention can also be improved as follows: the sub-etchant of the acidic cupric chloride etchant in step 1 further comprises an oxidant; on the etching production line, the automatic detection and charging control machine is used to control the charging amount of the sub-etchant according to the concentration of dissociated hydrogen ions detected, the charging amount of the oxidant according to the ORP detected, and the charging amount of water according to the specific density detected.

An oxidant is introduced to the etchant, and is added according to the ORP of the etchant detected by the automatic detection and charging control machine, allowing the machine to adjust and control the ORP and the concentration of dissociated hydrogen ions more rapidly.

Specifically, the oxidant is an aqueous oxidant solution and/or air.

The aqueous oxidant solution and air can be simultaneously or separately used; there are no limitations on the mixing ratio of the two oxidants when both employed; they can be mixed in any proportion, as long as the ORP of the etchant in the etching tank reaches the set control parameters.

The aqueous oxidant solution is $NaClO_3$ solution or $H_2O_2$ solution or an aqueous oxidant mixture; the aqueous oxidant mixture is comprised of $NaClO_3$ solution and an etchant additive, the etchant additive is NaCl and/or $NH_4Cl$; for a total weight percentage of 100%, the aqueous oxidant mixture contains 1%~20 wt % of the etchant additive.

There are no limitations on the mixing ratio of $NaClO_3$ solution and the etchant additive; they can be mixed in any proportion. There are no limitations on the mixing ratio of NaCl and $NH_4Cl$ when both used as the etchant additive, they can be mixed in any proportion.

In a preferred embodiment, air is selected as the oxidant; a vacuum fluidic aerating device is set up, which transfers the air into the etchant tank; the vacuum fluidic aerating device includes a liquid intake pipe, at least one acid-resistant pump, an air duct connected to the liquid intake pipe close to the acid-resistant pump, and a liquid outlet pipe; the liquid intake pipe, the acid-resistant pump and the liquid outlet pipe are successively connected. Preferably, the vacuum fluidic aerating device contains three or more acid-resistant pumps; the acid-resistant pumps are connected in series or in parallel or in a combination of both series and parallel.

When the vacuum fluidic aerating device is switched on, the acid-resistant pump starts running, and the etchant to be oxidized is pumped into the pump cavity via the liquid intake pipe. The rapidly flowing liquid in the liquid intake pipe creates negative pressure in the air duct; hence air is vacuumed into the liquid intake pipe and entres the acid-resistant pump cavity along with the liquid in the pipe. The blades in the pump cavity spin in a high speed to generate a high pressure, accelerating oxidation reactions between the liquid and the air. The oxidized etchant then flow back to the etching tank via the liquid outlet pipe. The number of acid-resistant pumps can be selected according to oxidation requirements: by increasing the number of acid-resistant pumps, oxidation time can be shortened and a better oxidizing result is obtained.

When the aqueous oxidant solution is used alone, only the automatic detection and charging control machine should be switched on. When air is used as a single oxidant, the vacuum fluidic aerating device should be turned on, the oxidant charging system of the automatic detection and charging control machine should be turned off. When both the aqueous oxidant solution and air are employed as oxidants, both the automatic detection and charging control machine and the vacuum fluidic aerating device should be switched on.

The present invention can also be improved as follows: employing scrappers or liquid spraying guns to process surfaces of the cathode board when electrolysis is stopped in step 2.

The scrapers can scrape repetitively on both sides of the cathode board, whereas the liquid spraying gun can spray the cathode chamber electrolyte onto both sides of the cathode board. Both methods can solve the usually difficult problem of removing the copper precipitate from the cathode board, by either scraping or scouring off the copper from the cathode board to the electrolysis tank. This effectively increases the level of automation and decreases labour intensity of the copper-removing process.

The present invention can be further improved as follows: pre-setting a time for continuous electrolysis, after which the electrolysis tank is automatically switched off, stopping electrolysis; removing the metal copper generated from the cathode board; filtering the cathode chamber electrolyte by a filter to separate the metal copper; transferring the filtrate obtained back to the cathode chamber; automatically switching on the electrolysis tank and restarting electrolysis when the liquid in the cathode chamber reaches a certain volume.

The filter is preferably a filter press.

The above-described improvements result in increased level of automation and decreased labour intensity in the electrolysis recycling process. As the copper powder on the cathode board is removed by employing e.g. a scraper or a liquid spraying gun, the copper falls into the electrolyte and is separated by filtering the cathode chamber electrolyte. The filtrate obtained is transferred back to the cathode chamber and re-electrolysed. After multiple filtering, the copper powder is collected for packing.

The present invention can be further improved as follows: connecting an electrolyte regenerating tank to the filter and the electrolysis cathode chamber; transferring the filtrate from the filter to the electrolyte regenerating tank; in the electrolyte regenerating tank, adjusting the concentration of copper ions in the filtrate to a concentration that is lower than the concentration of copper ions in the anode chamber electrolyte by employing said etchant waste charging device; directing the filtrate in the electrolyte regenerating tank into the electrolysis cathode chamber.

Adding an electrolyte regenerating tank allows electrolysis and filtration to be operated simultaneously, thereby improving efficiency: after the liquid in the cathode chamber entres the filter, the filtrate in the electrolyte regenerating tank can be immediately transferred to the emptied cathode chamber and electrolysed. The filtrate in the filter is then transferred to the electrolyte regenerating tank, followed by copper-ion concentration adjustment as stated above. When the next electrolysis process is completed and the cathode chamber electrolyte again entres the filter, the filtrate in the electrolyte regenerating tank can be transferred to the emptied electrolysis cathode chamber for electrolysis. Said etchant waste charging device is set to control the concentration of copper ions in the electrolyte regenerating tank, instead of controlling the concentration of copper ions in the cathode chamber electrolyte as discussed above.

During production, one or more filtrate transit tanks can be flexibly provided between the filter and the electrolyte regenerating tank: when filtration is completed, but the liquid in the electrolyte regenerating tank cannot be transferred to the cathode chamber as electrolysis is not yet finished, the filtrate in the filter can be first directed to a filtrate transit tank, and then transferred to the electrolyte regenerating tank when the latter is emptied.

The present invention can also be improved as follows: in step 1, the etchant waste is first filtered by a water-oil separator, after which the filtered etchant waste is transferred to the electrolysis tank. This process can remove impurities of the etchant waste before electrolysis, thereby giving better electrolysis results.

The present invention can also be improved as follows: providing a production signal detecting device at the etching production line; automatically cutting off the power of the electrolysis tank when no production signal is detected by the production signal detecting device.

When the production signal detecting device detects an interruption of the etching process or detects the ending of etching production, the power of the electrolysis tank is automatically cut off, achieving a safety interlock between etching and electrolysis.

The present invention can also be improved as follows: stirring and cooling the liquid in the cathode chamber in step 2. Commonly employed stirring and cooling devices or methods in the field can be selected, such as setting up a cooling pipe in the cathode chamber or adding a pump-out-flow-back stirring device that can cool down the liquid in the cathode chamber as well as uniformly distribute the components of the liquid. The reason for cooling the liquid is that the electrolytic diaphragm may be damaged at high temperatures. Therefore, the temperature of the liquids in the anode chamber and the cathode chamber need to be controlled to protect the electrolytic diaphragm and to increase electrolysis current efficiency.

The present invention can also be improved as follows: providing an etchant regenerating tank in step 5; transferring the liquid obtained at the end of step 4 to said etchant regenerating tank; in the etchant regenerating tank, mixing the liquid obtained at the end of step 4 with an unelectrolysed etchant waste; transferring the resulting mixture to the etching production line.

The present invention can be further improved as follows: regenerating a sub-etchant from said resulting mixture according to a composition of sub-etchant of said acidic cupric chloride etchant; transferring the sub-etchant regenerated to the sub-etchant tank of the automatic detection and charging control machine.

In the present invention, the oxidized electrolyte is first transferred to the etchant regenerating tank to mix with an unelectrolysed etchant waste, allowing the residual chlorine gas dissolved in the electrolyte to react with Cu(II) and Cu(I) ions in the etchant waste. The resulting mixture is then transferred to the etching production line as a chemically stable solution. According to specific requirements in production, it can also be directly stored or first converted to a sub-etchant according to composition of the sub-etchant, then stored. In this way, it can be added to the etching production line when in demand, increasing production flexibility.

Compared with the prior art, the invention has the following beneficial effects:

1. Chlorine gas formed in electrolysis is effectively absorbed and consumed: most of the electrolytically generated chlorine gas is immediately consumed by redox reactions with the electrolyte. The small volume of chlorine gas residual rapidly dissolves into the electrolyte, and is conveniently employed as an oxidant in the subsequent processes. There is no chlorine gas evolution throughout the process of the present invention; hence further spray treatment of chlorine gas is not required. Production accidents and air pollution due to the spreading of chlorine gas can be effectively avoided, promoting the health and wellbeing of the production staff.
2. Waste/poisonous substances in the prior art can be effectively recycled: by reacting with the electrolytically generated chlorine gas, Fe(II) and Cu(I) ions in the electrolyte are oxidized to Fe(III) and Cu(II) ions which are able to etch copper. Hence, the electrolysed etchant waste can be regenerated as an etchant and recycled. The small amount of chlorine gas residual is dissolved in the regenerated etchant and is conveniently used as an oxidant in the subsequent processes, effectively reducing the amount of aqueous oxidant solutions and sub-etchant used during etching, reducing overall cost of the etching process.
3. Controllable hydrogen gas generation: the concentration of copper ions in the cathode chamber electrolyte is monitored and controlled, effectively preventing the production of hydrogen gas due to low concentration of copper ions on the cathode board. As a result, less hydrochloric acid is consumed, hydrogen explosion accidents can be largely prevented.
4. High electrolysis current efficiency: electrolysis current efficiency of the present invention can reach 93% and above, which results in lowered production cost, decreased energy consumption and improved copper recycling efficiency. The complete recycling and regeneration method is stable, safe and cost-effective.
5. High level of automation: in the present invention, etching, electrolysis, recycling, and regeneration are integrated into one interconnected system. Etching rate can be conveniently changed by adjusting the composition of the etchant, and electrolysing rate can be accordingly modulated, so recycling rate matches with regeneration rate and etching rate. In this way, etching and electrolysis are smoothly synchronised. In addition, the use of machine to automatically collect metal copper from electrolysis and control the beginning and ending of electrolysis gives rise to a high level of automation throughout the whole method, reducing manpower required.
6. Decreased consumption of raw materials: the loss of hydrogen ions during electrolysis in the present invention is relatively small, so there is no need to add a substantial amount of HCl to the electrolyte in order to regenerate the sub-etchant, i.e. the amount of hydrochloric acid required significantly decreases. The chlorine gas produced during electrolysis can be used as an oxidant to oxidize Cu(I) ions and Fe(II) ions in the electrolyte, reducing the aqueous oxidant solution required to regenerate the sub-etchant. Furthermore, air is also used as an oxidant in the invention, so the use of aqueous oxidant solution is further decreased.
7. High quality of recycled copper: the copper recycled in the invention have a purity of more than 99%, and can be directly used in the fabrication of alloy, power cable and electric wire without further purification.
8. Reduced equipment size: as there is no chlorine gas evolution in electrolysis, there is no need to set up any spray absorption tower for chlorine gas treatment, reducing production space required. There is no limitation on the size ratio between the cathode chamber and anode chamber in the electrolysis tank, therefore the volume of electrolysis tank can be effectively decreased.
9. High etching quality: the etching method in the present invention gives high etching quality. In the embodiments below, etch factors for etching a circuit with copper foil thickness of 1 oz, line width and line spacing of 50.8 μm can be above 3.0, meeting requirements for etching PCBs with fine-line circuits.

The terminology used in the specification is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

BRIEF DESCRIPTION OF DRAWINGS

The present invention will hereinafter be described in conjunction with the appended drawings and embodiments.

DETAILED DESCRIPTION OF EMBODIMENTS

Figure 1:
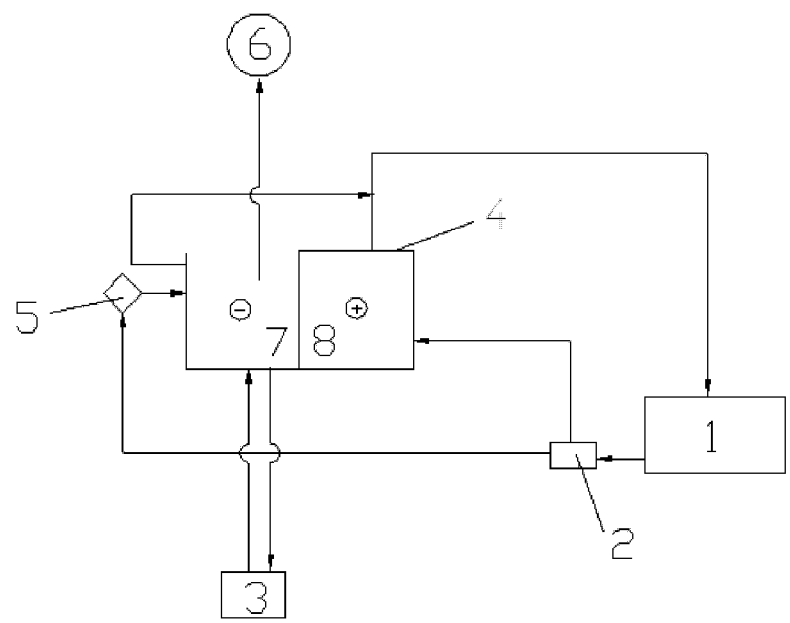
FIG. 1 is a schematic diagram illustrating an electrolytic recycling and regenerating apparatus employed in embodiment 1 of the present invention.

The invention is further described by the following exemplary embodiments. It should be understood that the description and specific examples are intended for purposes of illustration only and are not intended to limit the scope of the present disclosure. Nonessential modification and adjustments made by other people according to the invention still belong to the protection scope of the invention.

In the following exemplary embodiments and comparative examples, the ferric chloride used is preferably $FeCl_3$ produced by Guangzhou Chemical Reagent Factory; the ferrous chloride used is preferably $FeCl_2 \cdot 4H_2O$ produced by Guangzhou Chemical Reagent Factory; the iron used is preferably iron powder produced by Guangzhou Chemical Reagent Factory; the ferrous oxide used is preferably FeO (99.9%) produced by Sigma-Aldrich; the ferric oxide used is preferably $Fe_2O_3$ produced by Guangzhou Chemical Reagent Factory; the sodium chloride used is preferably NaCl (≥99.0) produced by Guangzhou Chemical Reagent Factory; the ammonium chloride used is preferably $NH_4Cl$ produced by Guangzhou Chemical Reagent Factory; the hydrochloric acid used is preferably 36.5% hydrochloric acid solution produced by Guangzhou Chemical Reagent Factory; the metal copper used is preferably copper powder produced by Guangzhou Chemical Reagent Factory; the cupric chloride used is preferably $CuCl_2 \cdot 2H_2O$ (≥99.0) produced by Guangzhou Chemical Reagent Factory; the $H_2O_2$ used is preferably 50% $H_2O_2$ produced by Guangzhou Chemical Reagent Factory; and the $NaClO_3$ used is preferably $NaClO_3$ (≥99.0) produced by Guangzhou Chemical Reagent Factory. The automatic detection and charging control machine used is preferably Yegao PCB acidic etching automatic charging control machine type-2 produced by Guangzhou Yegao Chemical Co., Ltd. Power of the acid-resistant pump used is preferably 20 kW. The electrolysis production line used is preferably PCB etching electrolysis circulatory production line produced by Guangzhou Yegao Chemical Co., Ltd. The electrolytic diaphragm used is preferably electrolytic membrane produced by Beijing Tingrun Company. The etching production line used is etching production line produced by Yuzhou PCB equipment factory. During the etching process, temperature of the etching tank is set to 49° C. and pressure of etchant nozzles is set to 2 $kg/cm^2$. During the electrolysis process, the anode is preferably a carbon plate electrode and the cathode is preferably a titanium plate electrode. The metal spectrometer used is preferably JHY-3900 metal spectrometer produced by Xiamen Jinheyuan Science and Technology Co., Ltd. The filter press used is preferably plate-and-frame filter press produced by Foshan Jinkaidi filtration equipment Co., Ltd. In addition to the above-listed products, those of skill in the art can also select products with similar properties to those listed herein according to conventional choices to achieve the object of the current invention.

In embodiments 1-10, the method for preparing an etchant and setting up an automatic detection and charging control machine are as follows:

Step 1: at ambient temperature and pressure, according to the designated components and their mixing ratios as shown in Table 2 below, selected raw materials were dissolved in water to prepare the sub-etchant; the sub-etchant was poured into a sub-etchant tank, which was connected to a charging pump controlled by a dissociated hydrogen ion concentration numerical control meter of the automatic detection and charging control machine;

Step 2: cupric chloride and/or metal copper was/were added to the prepared sub-etchant to reach the set value of the concentration of copper ions in Table 1; The mass of cupric chloride to be added into per liter of sub-etchant was be calculated according to formula 1, whereas the mass of metal copper added was calculated according to formula 2:

$$\frac{\text{molar mass of } CuCl_2}{\text{molar mass of copper ion}} = \frac{\text{mass of } CuCl_2 \text{ to be added per litre of sub-etchant}}{\text{mass of copper ion to be added per litre of sub} - \text{etchant}} \quad \text{(Formula 1)}$$

$$\frac{\text{molar of pre-added metal copper}}{\text{molar mass of copper ion corresponding to added metal copper}} = \frac{\text{mass of metal copper to be added per litre of sub-etchant}}{\text{mass of copper ion to be added per litre of sub-etchant}} \quad \text{(Formula 2)}$$

Wherein the molar mass of cupric chloride is 134.5 g/mol, and the molar mass of copper ion is 63.5 g/mol.

Step 3: the solution obtained in step 2 was poured into an etchant tank, and sensor probes on the automatic detection and charging control machine were immersed into the etchant.

Step 4: the automatic detection and charging control machine was set according to designated oxidant compositions in Table 1: ① when an aqueous oxidant solution was the only oxidant used, it was poured into an oxidant tank connected to a charging pump controlled by an ORP numerical control meter of the automatic detection and charging control machine; ② when both an aqueous oxidant solution and air are used as the oxidant, the aqueous oxidant solution was poured into the oxidant tank, and a vacuum fluidic aerating device was switched on; both the charging pump connected to the oxidant tank and the vacuum fluidic aerating device were controlled by the ORP numerical control meter; ③ when air was the only oxidant used, the charging system of aqueous oxidant solution was closed and the vacuum fluidic aerating device was switched on, and was controlled by the ORP numerical control meter; ④ when no oxidant was used, the ORP numerical control meter was used to control a charging pump connected to the sub-etchant tank, together with a dissociated hydrogen ion concentration numerical control meter.

Step 5: a charging pump controlled by a specific density numerical control meter of the automatic detection and charging control machine was connected to a water pipe.

Step 6: the temperature of the etchant tank was set to 50° C., the pressure of spray nozzles on the automatic detection and charging control machine was set to 2 $kg/cm^2$. On the machine, the concentration of dissociated hydrogen ions and the ORP were set to the values specified in Table 1. The automatic detection and charging control machine was started and the etchant was prepared. When the concentration of dissociated hydrogen ions and the ORP of the etchant arrived at the set numerical values, the numerical value of a specific density numerical control meter was set according to the reading of a hydrometer on the automatic detection and charging control machine and recorded in Table 1.

Step 7: a signal control system at the etching board entrance of the etching production line was safety interlocked with the power switch of the electrolysis tank; the etching operation was started; all components in the etchant were automatically charged and balanced by the automatic detection and charging control machine, the concentration of dissociated hydrogen ions, the ORP and the specific density were kept at the numerical values specified in Table 1.

Embodiment 1

The electrolysis electrolytic recycling and regenerating apparatus used in this embodiment is illustrated in FIG. 1. (1) In combination with the method above, according to the designated components and their mixing ratios as shown in Table 1 and 2 below, the etchant was prepared and the automatic detection and charging control machine was set up, and the etching operated was started. Etchant tank 1 was connected to the vacuum fluidic aerating device (not shown in FIG. 1); the vacuum fluidic aerating device comprises a liquid intake pipe, an acid-resistant pump, an air duct connected to the liquid intake pipe close to the acid-resistant pump, and a liquid outlet pipe; both the liquid intake pipe and the liquid outlet pipe were connected to the etching tank. (2) The etchant waste overflowed from etchant tank 1 was collected and treated by water-oil separator 2; the etchant waste contained products of copper-etching, such as ferrous chloride and cuprous chloride.

(3) The treated etchant waste was introduced to an electrolysis tank with a built-in electrolytic diaphragm. One part of the etchant waste was directly transferred to anode chamber 8, and the other part of the etchant waste was mixed with hydrochloric acid, ferric chloride and water in a cathode chamber electrolyte preparation tank (not shown in FIG. 1) to prepare a diluted etchant waste solution, its concentration of copper ions is as designated in Table 3; the result of [(total iron ion mass concentration in the diluted etchant waste solution−total iron ion mass concentration in the etchant waste)÷total iron ion mass concentration in the anode chamber electrolyte] is as designated in Table 3.

(4) The solution prepared was added to cathode chamber 7. A sealing cover plate 4 was installed on the top of the anode chamber 8. Scrapers were installed near the two sides of the cathode board (not shown in FIG. 1). Hydrogen gas exhaust system 6 was set above the cathode chamber to exhaust hydrogen gas generated at the cathode. The etchant waste charging device 5, which included a copper ion concentration monitor and a metering pump, was installed to control the concentration of copper ions in the cathode chamber electrolyte in real time. When the concentration of copper ions in cathode chamber electrolyte was detected to be lower than the set value in Table 3, the etchant waste charging device could automatically add unelectrolysed etchant waste to cathode chamber 7, until the concentration of copper ions in cathode chamber electrolyte is greater than or equal to the set value.

(5) Electrolysis was started: the safety interlock between the etching production line and the electrolysis line was switched on, in order to turn on the production signal detecting device at the etching production line; if no production signal was detected by the device, the power of the electrolysis tank would be automatically cut off. The etchant waste flow going into the anode chamber 8 and the electrolysis current density were adjusted. $Cl^-$ ions were oxidized to chlorine gas on the anode board; $Cu^{2+}$ ions were reduced to metal copper on the cathode board. The electrolyte was oxidized by the chlorine gas generated, and the chlorine gas was dissolved into the electrolyte in the effect of the ORP of the electrolyte. Fe(II) ions and Cu(I) ions in the electrolyte were oxidized to Fe(III) ions and Cu(II) ions by the chlorine gas which was fully dissolved into the electrolyte.

(6) A time for continuous electrolysis was pre-set to 30 minutes, after which the electrolysis tank was automatically switched off and the electrolysis process was stopped. The precipitated copper powder was removed from the cathode board by the scrapers and mixed with the cathode chamber electrolyte. The electrolyte which was mixed with copper powder was pumped to filter press 3 and filtered. The filtrate obtained was transferred back to cathode chamber 7. When the liquid in the cathode chamber 7 reached a certain volume, the electrolysis tank was automatically switched on and electrolysis was restarted. The copper powder was left in filter press 3. When the filter bag in filter press 3 was full, the collected copper powder was taken out and packed.

(7) The electrolytes from cathode chamber 7 and anode chamber 8 were separately transferred out of the electrolysis tank via two liquid outlet pipes, the liquid outlet pipe of the anode chamber was installed on the sealing cover plate 4. The two liquid outlet pipes were combined into one mixing pipe connected to the etchant tank, the electrolytes from cathode chamber 7 and anode chamber 8 were mixed inside the pipe, during which the chlorine gas dissolved in the anode chamber electrolyte was completely consumed.

Tests on etching and electrolysis quality: a 500×300 mm×1.5 mm, pure copper etching-rate test board was placed into the etching tank for spray etching, in order to measure the etching rate. A test aiming at measuring the etch factor and testing the stability of the electrolytic recycling and regenerating system was carried out by two-side spraying on a PCB with a size of 620×540 mm, copper foil thickness of 1 oz, line width and line spacing of 50.8 μm. The etching rate, etch factor K, and electrolysis current efficiency were measured and calculated using methods known in the art, e.g. those described in "*Printed Circuit Technique*" by Li Xueming, Occupational Skill Testing Authority of Electronic Industry of Ministry of Industry and Information Technology, 5$^{th}$ edition, pp. 387-389; "*Theory and Application of Metal Corrosion*", Wei Baoming, Chemical Industry Press, pp. 5-7; "*Discussion in Methods of Etch Factor Calculation*", Tian Ling, et al., printed circuit information, 2007, (No. 12), pp. 55-56. The purity of the copper generated was determined using a metal spectrometer. The experimental data was recorded in Table 4.

Embodiment 2

Figure 2:
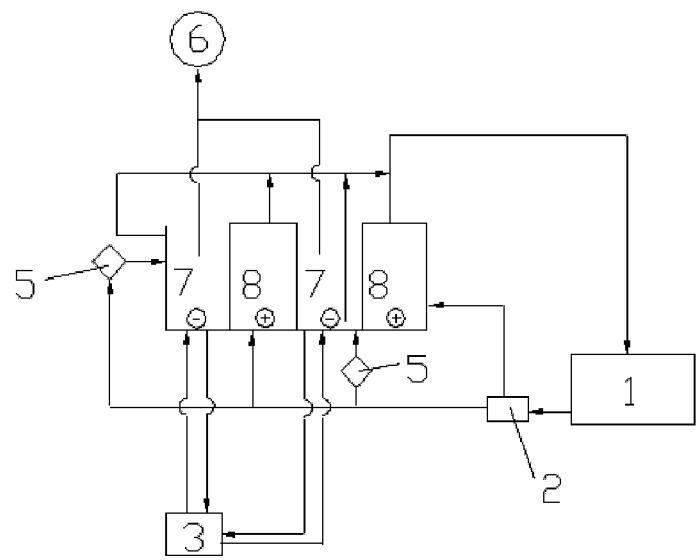
FIG. 2 is a schematic diagram illustrating an electrolytic recycling and regenerating apparatus employed in embodiment 2 of the present invention.

The electrolytic recycling and regenerating apparatus employed in this embodiment is illustrated in FIG. 2. Main differences between FIG. 2 and FIG. 1 are as follows: the electrolysis tank in FIG. 2 was separated by three electrolytic diaphragms into four chambers, which includes two cathode chambers 7 and two anode chambers 8. A cathode board is installed in each cathode chamber, and an anode board is installed in each anode.

The four chambers operate simultaneously during electrolysis.

The electrolytic recycling and regenerating method of this embodiment was the same as embodiment 1, except that:
(1) the etchant tank was not connected to the vacuum fluidic aerating device;
(2) the electrolytes from the cathode chamber 7 and anode chamber 8 were separately transferred to the etchant tank via two liquid outlet pipes.

The aqueous oxidant mixture used in the embodiment was comprised of 25 wt % of NaClO3, 12 wt % of NH4Cl, 1 wt % of NaCl, and 62 wt % of water.

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

Embodiment 3

Figure 3:
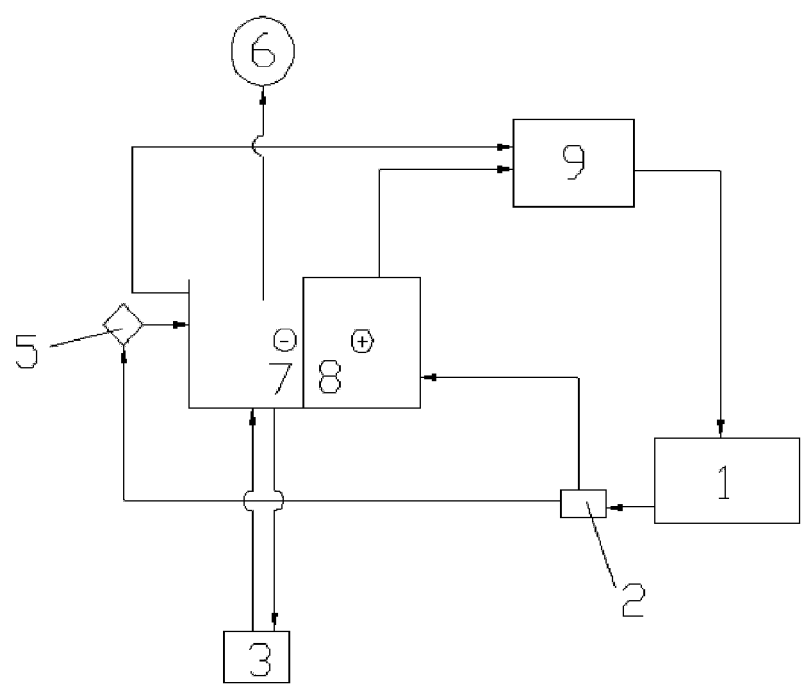
FIG. 3 is a schematic diagram illustrating an electrolytic recycling and regenerating apparatus employed in embodiment 3 of the present invention.

The electrolytic recycling and regenerating apparatus employed in this embodiment is illustrated in FIG. 3.

(1) In combination with the method above, according to the designated components and their mixing ratios as shown in Table 1 and 2 below, the etchant was prepared and the automatic detection and charging control machine was set up, and the etching operated was started. The aqueous oxidant mixture used in the embodiment was comprised of 15 wt % of NaClO3, 20 wt % of NH4Cl, and 65 wt % of water.

(2) The etchant waste overflowed from etchant tank 1 was collected and treated by water-oil separator 2; the etchant waste contained products of copper-etching, such as ferrous chloride and cuprous chloride.

(3) The treated etchant waste was introduced to an electrolysis tank with a built-in electrolytic diaphragm. One part of the etchant waste was directly transferred to anode chamber 8, and the other part of the etchant waste was mixed with hydrochloric acid, ferric chloride and water in a cathode chamber electrolyte preparation tank (not shown in FIG. 3) to prepare a diluted etchant waste solution, its concentration of copper ions is as designated in Table 3; the result of [(total iron ion mass concentration in the diluted etchant waste solution−total iron ion mass concentration in the etchant waste)÷total iron ion mass concentration in the anode chamber electrolyte] is as designated in Table 3.

(4) The solution prepared was added to cathode chamber 7. A sealing cover plate 4 was installed on the top of the anode chamber 8. Liquid spraying guns were installed near the two sides of the cathode board, and a pump-out-flow-back stirring device was installed inside cathode chamber 7 (both not shown in FIG. 3). Hydrogen gas exhaust system 6 was set above the cathode chamber to exhaust hydrogen gas generated at the cathode. The etchant waste charging device 5, which included a copper ion concentration monitor and a metering pump, was installed to control the concentration of copper ions in the cathode chamber electrolyte in real time. When the concentration of copper ions in cathode chamber electrolyte was detected to be lower than the set value in Table 3, the etchant waste charging device could automatically add unelectrolysed etchant waste to cathode chamber 7, until the concentration of copper ions in cathode chamber electrolyte is greater than or equal to the set value.

(5) Electrolysis was started: the safety interlock between the etching production line and the electrolysis line was switched on, in order to turn on the production signal detecting device at the etching production line; if no production signal was detected by the device, the power of the electrolysis tank would be automatically cut off. The etchant waste flow going into the anode chamber 8 and the electrolysis current density were adjusted. Cl⁻ ions were oxidized to chlorine gas on the anode board; $Cu^{2+}$ ions were reduced to metal copper on the cathode board. The electrolyte was oxidized by the chlorine gas generated, and the chlorine gas was dissolved into the electrolyte in the effect of the ORP of the electrolyte. Fe(II) ions and Cu(I) ions in the electrolyte were oxidized to Fe(III) ions and Cu(II) ions by the chlorine gas which was fully dissolved into the electrolyte.

(6) A time for continuous electrolysis was pre-set to 30 minutes, after which the electrolysis tank was automatically switched off and the electrolysis process was stopped. The cathode chamber electrolyte was sprayed onto the two sides of the cathode board by the liquid spraying guns, which pumped out the electrolyte from the electrolysis cathode chamber 7. The precipitated copper powder was removed from the cathode board and mixed with the cathode chamber electrolyte. The electrolyte which was mixed with copper powder was pumped to filter press 3 and filtered. The filtrate obtained was transferred back to cathode chamber 7. When the liquid in the cathode chamber 7 reached a certain volume, the electrolysis tank was automatically switched on and electrolysis was restarted. The copper powder was left in filter press 3. When the filter bag in filter press 3 was full, the collected copper powder was taken out and packed.

(7) The electrolytes from cathode chamber 7 and anode chamber 8 were separately transferred out of the electrolysis tank via two liquid outlet pipes, the liquid outlet pipe of the anode chamber was installed on the sealing cover plate 4. The electrolytes of the cathode chamber 7 and anode chamber 8 were thoroughly mixed with the etchant waste in etchant regenerating tank 9. During mixing, the chlorine gas residual dissolved in the electrolyte was completely consumed by the etchant waste. The mixture in the etchant regenerating tank 9 was pumped at a constant rate to etchant tank 1 by a controlling metering pump (not shown in the figure).

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

Embodiment 4

The electrolytic recycling and regenerating apparatus employed in this embodiment is illustrated in FIG. 3.

Figure 8:
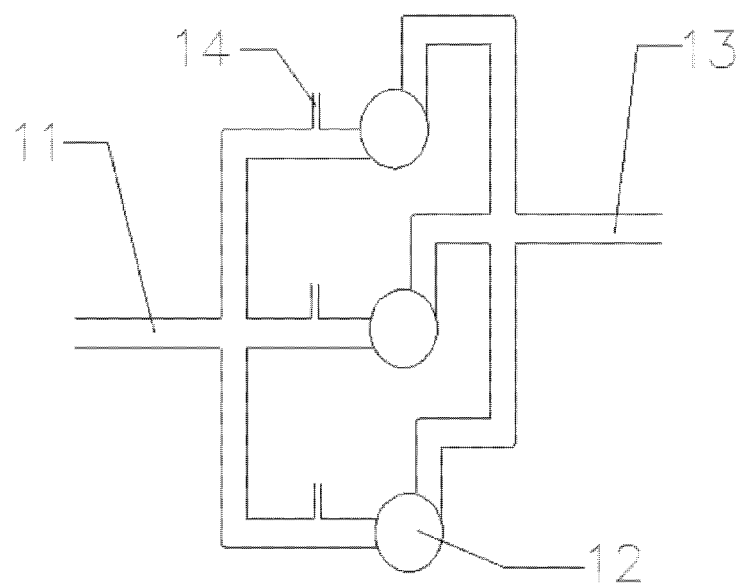
FIG. 8 is a schematic diagram illustrating a vacuum fluidic aerating device employed in embodiment 4 of the present invention.

The electrolytic recycling and regenerating method of this embodiment was the same as embodiment 3, except that:

(1) Etchant tank 1 was connected to a vacuum fluidic aerating device as illustrated in FIG. 8. The vacuum fluidic aerating device consisted a liquid intake pipe 11, three acid-resistant pumps 12 which were connected in parallel, air ducts 14 which were connected to the liquid intake pipe near each acid-resistant pump, and a liquid outlet pipe 13. Both the liquid intake pipe 11 and the liquid outlet pipe 12 were connected to the etching tank.

(2) In step (7), according to the designated components and their mixing ratios as shown in Table 2 below, a sub-etchant was regenerated from the mixture in the etchant regenerating tank 9. The regenerated sub-etchant was transferred into the sub-etchant tank of the automatic detection and charging control machine.

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

Embodiment 5

The electrolytic recycling and regenerating apparatus employed in this embodiment is illustrated in FIG. 3.

The electrolytic recycling and regenerating method of this embodiment was the same as embodiment 3, except that:

(1) The aqueous oxidant mixture used in the embodiment was comprised of 33 wt % of NaClO3, 1 wt % of NH4Cl, and 66 wt % of water.

(2) Scrapers instead of liquid spraying guns were installed near the two sides of the cathode board. When electrolysis was finished, the copper powder on the cathode board was scraped off and mixed with the cathode chamber electrolyte by bottom-up scraping of the scrapers.

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

Embodiment 6

The electrolytic recycling and regenerating apparatus employed in this embodiment is illustrated in FIG. 3.

Figure 7:
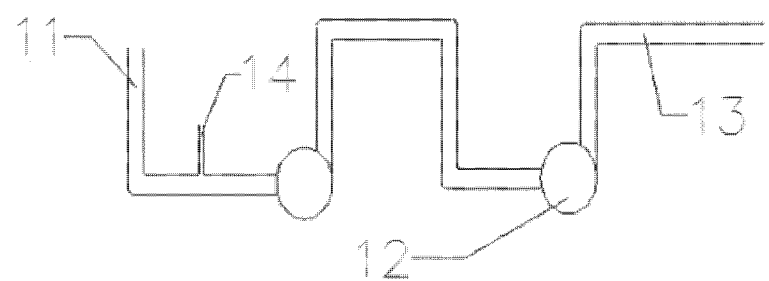
FIG. 7 is a schematic diagram illustrating a vacuum fluidic aerating device employed in embodiment 6 of the present invention.

The electrolytic recycling and regenerating method of this embodiment was the same as embodiment 3, except that: etchant tank 1 was connected to a vacuum fluidic aerating device as illustrated in FIG. 7. The vacuum fluidic aerating device included a liquid intake pipe 11, two acid-resistant pumps 12 which were connected in series, one air duct 14 connected to the liquid intake pipe near the first acid-resistant pump, and a liquid outlet pipe 13. Both the liquid intake pipe 11 and the liquid outlet pipe 12 were connected to the etching tank.

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

Embodiment 7

The electrolytic recycling and regenerating apparatus employed in this embodiment is illustrated in FIG. 1.

The electrolytic recycling and regenerating method of this embodiment was the same as embodiment 1.

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

Embodiment 8

The electrolytic recycling and regenerating apparatus employed in this embodiment is illustrated in FIG. 1.

The electrolytic recycling and regenerating method of the embodiment was the same as that of Embodiment 1.

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

Embodiment 9

Figure 4:
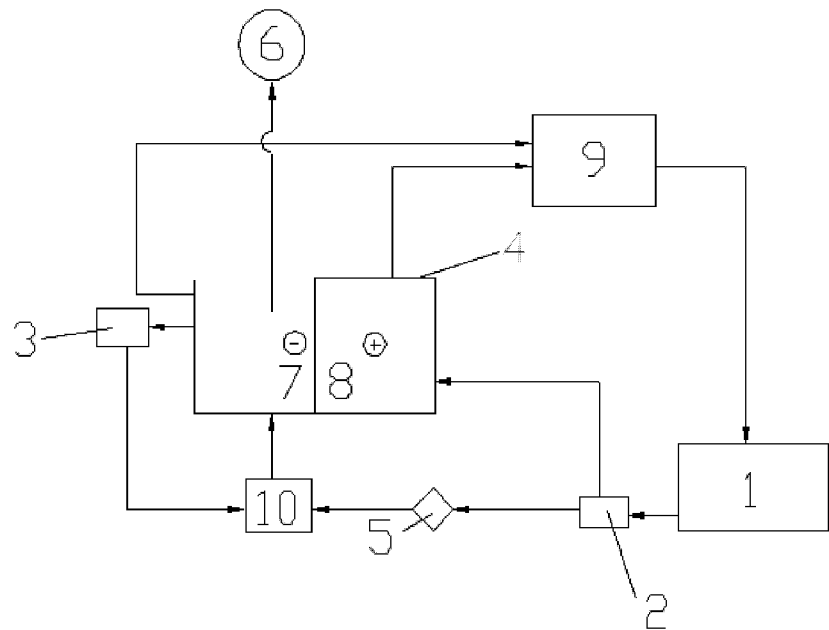
FIG. 4 is a schematic diagram illustrating an electrolytic recycling and regenerating apparatus employed in embodiment 9 of the present invention.

The electrolytic recycling and regenerating apparatus employed in this embodiment is illustrated in FIG. 4.
(1) In combination with the method above, according to the designated components and their mixing ratios as shown in Table 1 and 2 below, the etchant was prepared and the automatic detection and charging control machine was set up, and the etching operation was started.
(2) The etchant waste overflowed from etchant tank 1 was collected and treated by water-oil separator 2; the etchant waste contained products of copper-etching, such as ferrous chloride and cuprous chloride.
(3) The treated etchant waste was introduced to an electrolysis tank with a built-in electrolytic diaphragm. One part of the etchant waste was directly transferred to anode chamber 8, and the other part of the etchant waste was mixed with hydrochloric acid, ferric chloride and water in a cathode chamber electrolyte preparation tank (not shown in FIG. 4) to prepare a diluted etchant waste solution, the concentration of copper ions of which was as designated in Table 3; the result of [(total iron ion mass concentration in the diluted etchant waste solution−total iron ion mass concentration in the etchant waste)÷total iron ion mass concentration in the anode chamber electrolyte] is as designated in Table 3.
(4) The solution prepared was added to cathode chamber 7. A sealing cover plate 4 was installed on the top of the anode chamber 8. Scrapers were installed near the two sides of the cathode board (not shown in FIG. 4). Hydrogen gas exhaust system 6 was set above the cathode chamber to exhaust hydrogen gas generated at the cathode.
(5) Electrolysis was started: the safety interlock between the etching production line and the electrolysis line was switched on, in order to turn on the production signal detecting device at the etching production line; if no production signal was detected by the device, the power of the electrolysis tank would be automatically cut off. The etchant waste flow going into the anode chamber 8 and the electrolysis current density were adjusted. Cl ions were oxidized to chlorine gas on the anode board; $Cu^{2+}$ ions were reduced to metal copper on the cathode board. The electrolyte was oxidized by the chlorine gas generated, and the chlorine gas was dissolved into the electrolyte in the effect of the ORP of the electrolyte. Fe(II) ions and Cu(I) ions in the electrolyte were oxidized to Fe(III) ions and Cu(II) ions by the chlorine gas which was fully dissolved into the electrolyte.
(6) A time for continuous electrolysis was pre-set to 40 minutes, after which the electrolysis tank was automatically switched off and the electrolysis process was stopped. The precipitated copper powder was removed from the cathode board by the scrapers and mixed with the cathode chamber electrolyte. The electrolyte which was mixed with copper powder was pumped to filter press 3 and filtered. The filtrate obtained was transferred back to cathode chamber 7. When the liquid in the cathode chamber 7 reached a certain volume, the electrolysis tank was automatically switched on and electrolysis was restarted. The copper powder was left in filter press 3. When the filter bag in filter press 3 was full, the collected copper powder was taken out and packed.
(7) Electrolyte regenerating tank 10 was connected to the filter press 3 and the electrolysis cathode chamber 7 to collect filtrate from press-filtration. The composition of the solution in the electrolyte regenerating tank 10 was adjusted by etchant waste charging device 5, and was then transferred back to the electrolysis cathode chamber 7. More specifically, the etchant waste charging device 5, which included a copper-ion concentration monitor and a metering pump, controlled the concentration of copper ions of the solution in electrolyte regenerating tank 10 in real time. When the concentration of copper ions of the solution in electrolyte regenerating tank 10 was detected to be lower than the set value of the concentration of copper ions in cathode chamber electrolyte specified in Table 3, the etchant waste was automatically added to the etchant waste regenerating tank 10 by the etchant waste charging device, until the concentration of copper ions in cathode chamber electrolyte is greater than or equal to the set value. In this embodiment, electrolysis and filtration could be carried out at the same time to increase production efficiency: after the liquid in cathode chamber 7 entered the filter press 3, the filtrate in electrolyte regenerating tank 10 was transferred to the emptied cathode chamber 7 and immediately electrolysed. The filtrate in filter press 3 was then transferred to electrolyte regenerating tank 10, followed by composition adjustments as stated above. When the next electrolysis process in the cathode chamber 7 was completed and the cathode chamber electrolyte again entered filter press 3, the filtrate in electrolyte regenerating tank 10 was transferred to the emptied cathode chamber for electrolysis.

(8) The electrolytes from cathode chamber 7 and anode chamber 8 were separately transferred out of the electrolysis tank via two liquid outlet pipes, the liquid outlet pipe of the anode chamber was installed on the sealing cover plate 4. The electrolytes of the cathode chamber 7 and anode chamber 8 were thoroughly mixed with the etchant waste in etchant regenerating tank 9. During mixing, the chlorine gas residual dissolved in the electrolyte was completely consumed by the etchant waste. The mixture in the etchant regenerating tank 9 was pumped at a constant rate to etchant tank 1 by a controlling metering pump (not shown in the figure).

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

Embodiment 10

Figure 5:
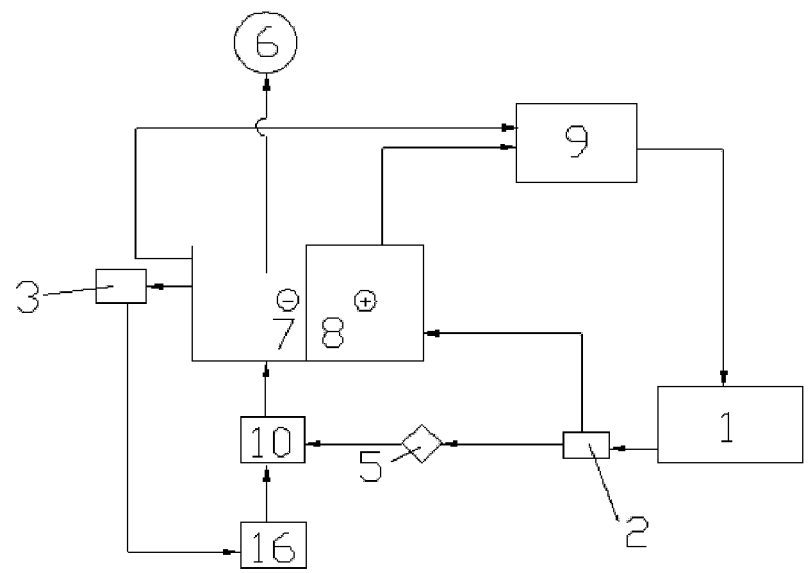
FIG. 5 is a schematic diagram illustrating an electrolytic recycling and regenerating apparatus employed in embodiment 10 of the present invention.

The electrolytic recycling and regenerating apparatus employed in this embodiment is illustrated in FIG. 5.

The electrolytic recycling and regenerating method of this embodiment was the same as embodiment 9, except that:

A filtrate transit tank 16 was connected to the filter press 3 and the electrolyte regenerating tank 10. In step (7), when press-filtration was completed in the filter press 3, but the filtrate from the previous filtration batch in the electrolyte regenerating tank 10 could not be transferred to the cathode chamber as electrolysis was not yet finished, the filtrate in filter press 3 was first transferred to filtrate transit tank 16, then transferred to electrolyte regenerating tank 10 when the latter is emptied.

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

COMPARATIVE EXAMPLE

Figure 6:
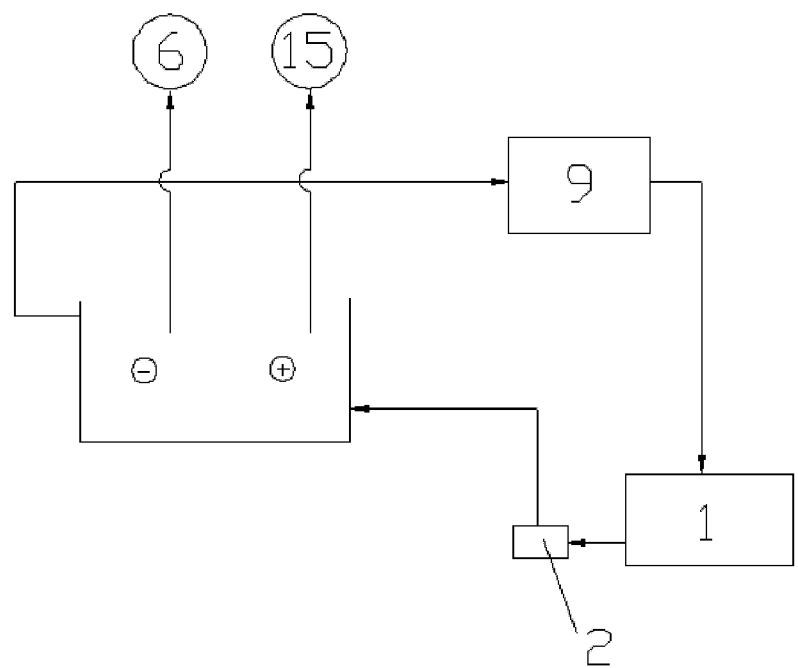
FIG. 6 is a schematic diagram illustrating an apparatus employed in the comparative example of the present invention.

The apparatus employed in this comparative example is illustrated in FIG. 6.

(1) At ambient temperature and pressure, 31% HCl solution was employed as a sub-etchant. The sub-etchant was added into a sub-etchant tank, which was connected to a charging pump controlled by a dissociated hydrogen ion concentration numerical control meter of the automatic detection and charging control machine.

(2) Into per liter of the sub-etchant, 275.4 g of cupric chloride was added; the concentration of copper ions in the final solution obtained was 130 g/L.

(3) The solution obtained in step (2) was added into an etchant tank. Sensor probes on the automatic detection and charging control machine were immersed into the etchant inside the etchant tank.

(4) 35% $NaClO_3$ solution was employed as the oxidant, and was poured into an oxidant tank. The oxidant tank was connected to a charging pump controlled by an ORP numerical control meter of the automatic detection and charging control machine. A charging pump controlled by a specific density numerical control meter of the automatic detection and charging control machine was connected to a water pipe.

(5) The temperature of the etchant tank was set to 50° C., the pressure of spray nozzles of the automatic detection and charging control machine was set to 2 $kg/cm^2$. On the automatic detection and charging control machine, the concentration of dissociated hydrogen ions was set to 3M, the ORP was set to 520 mV. The automatic detection and charging control machine was switched on, the etchant was prepared, and etching operation was started. When the concentration of dissociated hydrogen ions and the ORP in the etchant arrived at the set numerical values, the numerical value of a specific density numerical control meter on the machine was set according to the reading of the hydrometer on the machine (1.30 g/L).

(6) A signal control system at the etching board entrance of the etching production line was safety interlocked with the power switch of the electrolysis tank; the etching operation was started; all components in the etchant were automatically charged and balanced by the automatic detection and charging control machine, the concentration of dissociated hydrogen ions, the ORP and the specific density were kept at the numerical values specified in Table 1 and above.

(7) The etchant waste overflowed from etchant tank was collected; it contained products of copper-etching, such as ferrous chloride and cuprous chloride.

(8) The etchant waste was transferred to an electrolysis tank for electrolysis;

(9) Electrolysis was started: the safety interlock between the etching production line and the electrolysis line was switched on. The etchant waste flow going into the anode chamber was adjusted. The electrolysis current density was set to 3 $A/dm^2$. Chloride ions were oxidized to chlorine gas on the anode board, whereas cuprous ions were reduced to metal copper on the cathode board. The generated chlorine gas was exhausted and treated by sodium hydroxide solution in chlorine gas exhaust and neutralising treatment system 15, whereas the hydrogen gas generated was exhausted by hydrogen gas exhaust system 6.

(10) The electrolyte was transferred to etchant regenerating tank 9 via a liquid outlet pipe; hydrochloric acid was added to the electrolyte in the etchant regenerating tank 9, until the weight percentage of HCl in the electrolyte reached 31%. The solution obtained was poured into the sub-etchant tank and used as a sub-etchant.

The methods described in embodiment 1 were employed to test etching effect and electrolysis quality. Etching rate, etch factor K, and electrolysis current efficiency were measured and calculated. The purity of electrolytic metal copper was determined using a metal spectrometer. The experimental data was recorded in Table 4.

TABLE 1

| Embodiments | Parameters of automatic detection and charging control machine | | | | |
|---|---|---|---|---|---|
| | Concentration of dissociated hydrogen ions (M) | ORP (mV) | Specific density (g/ml) | Oxidants | Concentration of copper Ions (g/L) |
| Embodiment 1 | 0.1 | 700 | 1.45 | 35% $NaClO_3$ solution + air | 15 |
| Embodiment 2 | 0.2 | 500 | 1.35 | Aqueous oxidant mixture | 25 |
| Embodiment 3 | 1.0 | 560 | 1.30 | Aqueous oxidant mixture | 150 |
| Embodiment 4 | 0.7 | 400 | 1.20 | Air | 20 |
| Embodiment 5 | 1.5 | 650 | 1.30 | Aqueous oxidant mixture | 60 |
| Embodiment 6 | 2.0 | 420 | 1.40 | Air | 180 |
| Embodiment 7 | 3.0 | 620 | 1.28 | 27.5% $H_2O_2$ aqueous solution | 140 |
| Embodiment 8 | 4.0 | 460 | 1.30 | 35% $NaClO_3$ aqueous solution | 40 |
| Embodiment 9 | 5.0 | 360 | 1.30 | None | 60 |
| Embodiment 10 | 5.0 | 360 | 1.30 | None | 60 |

TABLE 2

| Embodiments | Sub-etchant | | | | | | | | | | |
|---|---|---|---|---|---|---|---|---|---|---|---|
| | Water (wt %) | $FeCl_3$ (wt %) | $FeCl_2$ (wt %) | Fe (wt %) | FeO (wt %) | $Fe_2O_3$ (wt %) | $Cu_2Cl_2$ (wt %) | $CuCl_2$ (wt %) | NaCl (wt %) | $NH_4Cl$ (wt %) | HCl (wt %) |
| Embodiment 1 | 63 | 35 | 0 | 0 | 0 | 0 | 0 | 0 | 0 | 0 | 2 |
| Embodiment 2 | 72 | 0 | 25 | 0 | 0 | 0 | 0 | 0 | 0 | 0 | 3 |
| Embodiment 3 | 77 | 1 | 0 | 0 | 0 | 0 | 0 | 0 | 0 | 0 | 22 |
| Embodiment 4 | 61.999 | 30 | 0 | 0 | 0 | 0 | 0.001 | 0 | 0 | 0 | 8 |
| Embodiment 5 | 43 | 0 | 8 | 0 | 0 | 10 | 1 | 2 | 8 | 0 | 28 |
| Embodiment 6 | 51 | 0 | 5 | 10 | 0 | 0 | 0 | 0 | 0 | 1 | 33 |
| Embodiment 7 | 48 | 3 | 0 | 0 | 0 | 0 | 14 | 0 | 2 | 3 | 30 |
| Embodiment 8 | 26 | 10 | 5 | 5 | 5 | 5 | 8 | 0 | 0 | 0 | 36 |
| Embodiment 9 | 49.5 | 0 | 0 | 3.5 | 0 | 0 | 0 | 10 | 0 | 1 | 36 |
| Embodiment 10 | 49.5 | 0 | 0 | 3.5 | 0 | 0 | 0 | 10 | 0 | 1 | 36 |

TABLE 3

| Embodiments | Current density (A/dm²) | Conc. of copper ions in cathode chamber electrolyte (g/L) | Conc. of copper ions in anode chamber electrolyte (g/L) | (total mass concentration of iron ions in said diluted etchant waste solution-total mass concentration of iron ions in said etchant waste) ÷total mass concentration of iron ions in the anode chamber electrolyte |
|---|---|---|---|---|
| Embodiment 1 | 2 | 3 | 15 | −50% |
| Embodiment 2 | 3 | 10 | 25 | −40% |
| Embodiment 3 | 2 | 80 | 150 | 50% |
| Embodiment 4 | 9 | 19.5 | 20 | −45% |
| Embodiment 5 | 3 | 30 | 60 | −20% |
| Embodiment 6 | 15 | 150 | 180 | −30% |
| Embodiment 7 | 5 | 100 | 140 | 10% |

TABLE 3-continued

| Embodiments | Current density (A/dm$^2$) | Conc. of copper ions in cathode chamber electrolyte (g/L) | Conc. of copper ions in anode chamber electrolyte (g/L) | (total mass concentration of iron ions in said diluted etchant waste solution-total mass concentration of iron ions in said etchant waste) ÷total mass concentration of iron ions in the anode chamber electrolyte |
|---|---|---|---|---|
| Embodiment 8 | 3 | 15 | 40 | −50% |
| Embodiment 9 | 1 | 50 | 60 | 0% |
| Embodiment 10 | 1 | 40 | 60 | 0% |

TABLE 4

| Embodiments | Etching rate (μm/min) | Etch factor K | Purity of recycled copper metal (%) | Current efficiency (%) | Chlorine gas evolution |
|---|---|---|---|---|---|
| Comparative Example | 35 | 1.7 | 99.3 | 75.0 | Obvious chlorine gas smell |
| Embodiment 1 | 39 | 5.9 | 99.1 | 93.2 | No obvious chlorine gas smell |
| Embodiment 2 | 37 | 5.2 | 99.2 | 78.7 | No obvious chlorine gas smell |
| Embodiment 3 | 38 | 2.8 | 99.7 | 94.7 | No obvious chlorine gas smell |
| Embodiment 4 | 41 | 5.7 | 99.3 | 25.4 | No obvious chlorine gas smell |
| Embodiment 5 | 48 | 5.6 | 99.5 | 95.5 | No obvious chlorine gas smell |
| Embodiment 6 | 38 | 3.2 | 99.6 | 14.3 | No obvious chlorine gas smell |
| Embodiment 7 | 42 | 2.4 | 99.5 | 55.8 | No obvious chlorine gas smell |
| Embodiment 8 | 46 | 4.9 | 99.2 | 93.9 | No obvious chlorine gas smell |
| Embodiment 9 | 36 | 2.7 | 99.7 | 156.1 | No obvious chlorine gas smell |
| Embodiment 10 | 38 | 2.8 | 99.6 | 141.7 | No obvious chlorine gas smell |

What is claimed is:

1. A method for electrolytic recycling and regenerating acidic cupric chloride etchants, comprising:

step 1: employing an acidic cupric chloride etchant that contains iron ions in PCB etching, controlling the oxidation-reduction potential (ORP) of said acidic cupric chloride etchant within the range of 360-700 mV;

step 2: transferring an etchant waste of said iron ions-containing acidic cupric chloride etchant to an electrolysis tank; electrolysing said etchant waste; installing an electrolytic diaphragm inside the electrolysis tank, separating the electrolysis tank into an anode chamber and a cathode chamber which respectively encloses an anode and a cathode, wherein the electrolytic diaphragm creates a copper ion concentration difference between an anode chamber electrolyte and a cathode chamber electrolyte, and keeps a concentration of copper ions in the cathode chamber electrolyte lower than a concentration of copper ions in the anode chamber electrolyte, in order to improve current efficiency in electrolysis;

step 3: generating metal copper on a cathode board and oxidizing chlorine ions to chlorine gas on an anode board in the electrolysis process of step 2; the chlorine gas generated oxidizes the electrolyte in the electrolysis tank and is dissolved into the electrolyte, in the effect of the ORP of the electrolyte;

step 4: regenerating an etchant by oxidizing Fe(II) ions and Cu(I) ions in the electrolyte to form Fe(III) ions and Cu(II) ions using the chlorine gas that is fully dissolved into the electrolyte; and step 5: transferring the etchant regenerated in step 4 to an etching production line, wherein in step 2, the initial total mass concentration of iron ions in the cathode electrolyte satisfies the formula:

−50%≤[(initial total mass concentration of iron ions in the cathode electrolyte-total mass concentration of iron ions in said etchant waste)÷total mass concentration of iron ions in the anode chamber electrolyte]≤50%, wherein the initial total mass concentration of iron ions in the cathode electrolyte >0, and the total mass concentration of iron ions in said etchant waste >0.

2. The method for electrolytic recycling and regenerating acidic cupric chloride etchants according to claim 1, wherein in step 2, transferring said etchant waste to the anode chamber, transferring a diluted etchant waste solution to the cathode chamber; in said diluted etchant waste solution, only a mass concentration of copper ions in the etchant waste is diluted, so that the mass concentration of copper ions in said diluted etchant waste solution is lower than that in the etchant waste; the total mass concentration of iron ions in the diluted etchant waste solution satisfies the formula:

−50%≤[(total mass concentration of iron ions in said diluted etchant waste solution-total mass concentration of iron ions in said etchant waste)÷total mass concentration of iron ions in the anode chamber electrolyte]≤50%.

3. The method for electrolytic recycling and regenerating acidic cupric chloride etchants according to claim 1, further comprising: maintaining the mass concentration of copper ions in the cathode chamber electrolyte lower than the mass concentration of copper ions in the anode chamber electrolyte by employing an etchant waste charging device, wherein said etchant waste device controls the mass concentration of copper ions in the cathode chamber electrolyte in real time.

4. The method for electrolytic recycling and regenerating acidic cupric chloride etchants according to claim 1, further comprising: installing a sealing cover plate on the top of the anode chamber.

5. The method for electrolytic recycling and regenerating acidic cupric chloride etchants according to claim 4, further comprising: installing a liquid intake pipe and a liquid outlet pipe on both the cathode chamber and the anode chamber, wherein said liquid outlet pipe of the anode chamber is installed on the sealing cover plate.

6. The method for electrolytic recycling and regenerating acidic cupric chloride etchants according to claim 1, further comprising: setting a hydrogen gas exhaust system above the said cathode chamber.

7. The method for electrolytic recycling and regenerating acidic cupric chloride etchants according to claim 1, wherein the acidic cupric chloride etchant in step 1 comprises cupric chloride and a sub-etchant; an automatic detection and charging control machine is employed to detect the concentration of dissociated hydrogen ions, ORP and specific density parameters of the acidic cupric chloride etchant and to control the charging amount of each component, allowing the concentration of copper ions, the concentration of dissociated hydrogen ions and the ORP in the acidic cupric chloride etchant solution to reach set numerical values; for a total weight percentage of 100%, the sub-etchant comprises the following components in weight percentage:
2%-36% of HCl;
1%-35% of one or more compounds selected from $FeCl_3$, $FeCl_2$, Fe, FeO and $Fe_2O_3$; and
the balance of water,
the control parameters of the acidic cupric chloride etchant obtained are set as follows: the concentration of dissociated hydrogen ions is 0.2-5.0M, the ORP is 360-700 mV and the concentration of copper ions is 15-180 g/L.

8. The method for electrolytic recycling and regenerating acidic cupric chloride etchants according to claim 7, further comprising: employing the automatic detection and charging control machine on the etching production line to detect the concentration of dissociated hydrogen ions, the ORP and the specific density of the acidic cupric chloride etchant, in order to control the charging of the sub-etchant according to the concentration of dissociated hydrogen ions and ORP detected, and also to control the charging of water according to the specific density detected, so the concentration of dissociated hydrogen ions is 0.2-5.0M, the ORP is 380-700 mV and the concentration of copper ions is 15-180 g/L.

9. The method for electrolytic recycling and regenerating acidic cupric chloride etchants according to claim 7, wherein for a total weight percentage of 100%, the sub-etchant comprises the following components in weight percentage: 2%-30% of HCl; 3%-30% of one or more compounds selected from $FeCl_3$, $FeCl_2$, Fe, FeO and $Fe_2O_3$; and the balance of water.

10. The method for electrolytic recycling and regenerating acidic cupric chloride etchants according to claim 9, wherein for a total weight percentage of 100%, the sub-etchant comprises the following components in weight percentage: 3%-28% of HCl; 3.5%-25% of one or more compounds selected from $FeCl_3$, $FeCl_2$, Fe, FeO and $Fe_2O_3$; and the balance of water.

11. The method for electrolytic recycling and regenerating acidic cupric chloride etchants according to claim 7, wherein the control parameters are as follows: the concentration of dissociated hydrogen ions is 0.2-4.0M, the ORP is 380-700 mV and the concentration of copper ions is 15-180 g/L.

12. The method for electrolytic recycling and regenerating acidic cupric chloride etchants according to claim 11, wherein the control parameters are as follows: the concentration of dissociated hydrogen ions is 0.2-4.0M, the ORP is 400-650 mV and the concentration of copper ions is 20-150 g/L.

13. The method for electrolytic recycling and regenerating acidic cupric chloride etchants according to claim 11, wherein the control parameters are as follows: the concentration of dissociated hydrogen ions is 0.2-3.0M, the ORP is 400-620 mV and the concentration of copper ions is 25-140 g/L.

14. The method for electrolytic recycling and regenerating acidic cupric chloride etchants according to claim 7, wherein the sub-etchant of the acidic cupric chloride etchant in step 1 further comprising 0.001 wt %-14 wt % of cupric chloride and/or cuprous chloride.

15. The method for electrolytic recycling and regenerating acidic cupric chloride etchants according to claim 14, wherein the sub-etchant of the acidic cupric chloride etchant in step 1 further comprising 1 wt %-8 wt % of an etchant additive, said etchant additive is NaCl and/or $NH_4Cl$.

16. The method for electrolytic recycling and regenerating acidic cupric chloride etchants according to claim 7, wherein the sub-etchant of the acidic cupric chloride etchant in step 1 further comprising an oxidant; on the etching production line, the automatic detection and charging control machine is used to control the charging amount of the sub-etchant according to the concentration of dissociated hydrogen ions detected, the charging amount of the oxidant according to the ORP detected, and the charging amount of water according to the specific density detected.

17. The method for electrolytic recycling and regenerating acidic cupric chloride etchants according to claim 16, wherein the oxidant is an aqueous oxidant solution and/or air.

18. The method for electrolytic recycling and regenerating acidic cupric chloride etchants according to claim 17, wherein the aqueous oxidant solution is $NaClO_3$ solution, $H_2O_2$ solution, or an aqueous oxidant mixture; the aqueous oxidant mixture comprises $NaClO_3$ solution and an etchant additive, the etchant additive is NaCl and/or $NH_4Cl$; for a total weight percentage of 100%, the aqueous oxidant mixture contains 1%~20 wt % of the etchant additive.

19. The method for electrolytic recycling and regenerating acidic cupric chloride etchants according to claim 16, further comprising: selecting air as the oxidant; setting up a vacuum fluidic aerating device, which transfers the air into the etchant tank; the vacuum fluidic aerating device includes a liquid intake pipe, at least one acid-resistant pump, an air duct connected to the liquid intake pipe close to the acid-resistant pump, and a liquid outlet pipe; the liquid intake pipe, the acid-resistant pump and the liquid outlet pipe are successively connected.

20. The method for electrolytic recycling and regenerating acidic cupric chloride etchants according to claim 19, wherein the vacuum fluidic aerating device contains three or more acid-resistant pumps; the acid-resistant pumps are connected in series, in parallel, or in a combination of both series and parallel.

21. The method for electrolytic recycling and regenerating acidic cupric chloride etchants according to claim 1, further comprising: pre-setting a time for continuous electrolysis, after which the electrolysis tank is automatically switched off and the electrolysis is stopped; removing the metal copper generated from the cathode board; filtering the cathode chamber electrolyte by a filter to separate the metal copper; transferring the filtrate obtained back to the cathode chamber; and automatically switching on the electrolysis tank and restarting electrolysis when the liquid in the cathode chamber reaches a certain volume.

22. The method for electrolytic recycling and regenerating acidic cupric chloride etchants according to claim 21, wherein the filter is a filter press.

23. The method for electrolytic recycling and regenerating acidic cupric chloride etchants according to claim 21, further comprising: connecting an electrolyte regenerating tank to the filter and the electrolysis cathode chamber; transferring the filtrate from the filter to the electrolyte regenerating tank; in the electrolyte regenerating tank, adjusting the concentration of copper ions in the filtrate to a concentration that is lower than the concentration of copper ions in the anode chamber electrolyte by employing said etchant waste charging device; and directing the filtrate in the electrolyte regenerating tank into the electrolysis cathode chamber.

24. The method for electrolytic recycling and regenerating acidic cupric chloride etchants according to claim 1, further comprising: providing an etchant regenerating tank in step 5; transferring the liquid obtained at the end of step 4 to said etchant regenerating tank; in the etchant regenerating tank, mixing the liquid obtained at the end of step 4 with an unelectrolysed etchant waste; and transferring the resulting mixture to the etching production line.

25. The method for electrolytic recycling and regenerating acidic cupric chloride etchants according to claim 24, further comprising: regenerating a sub-etchant from said resulting mixture according to a composition of sub-etchant of said acidic cupric chloride etchant; and transferring the sub-etchant regenerated to the sub-etchant tank of the automatic detection and charging control machine.

\* \* \* \* \*